United States Patent
Hande et al.

(10) Patent No.: US 11,075,608 B1
(45) Date of Patent: Jul. 27, 2021

(54) SYSTEM AND METHOD TO REDUCE STANDBY POWER DISSIPATION IN CLASS D AMPLIFIERS

(71) Applicant: Harman Professional, Inc., Northridge, CA (US)

(72) Inventors: Abhiman Ananthakrishna Hande, Plano, TX (US); Mark Edward Sieber, Wylie, TX (US); Austin Clay Styer, Melissa, TX (US)

(73) Assignee: Harman Professional, Inc., Northridge (CA)

( * ) Notice: Subject to any disclaimer, the term of this patent is extended or adjusted under 35 U.S.C. 154(b) by 23 days.

(21) Appl. No.: 16/822,610

(22) Filed: Mar. 18, 2020

(51) Int. Cl.
*H03F 1/56* (2006.01)
*H03F 1/02* (2006.01)
*H03F 3/217* (2006.01)

(52) U.S. Cl.
CPC ............ *H03F 1/565* (2013.01); *H03F 1/0205* (2013.01); *H03F 3/2173* (2013.01)

(58) Field of Classification Search
CPC ...................................................... H03F 1/565
See application file for complete search history.

(56) References Cited

U.S. PATENT DOCUMENTS

| | | | | |
|---|---|---|---|---|
| 6,362,979 | B1* | 3/2002 | Gucyski | H02J 9/062 363/17 |
| 9,825,545 | B2* | 11/2017 | Chen | H02M 3/158 |
| 10,186,971 | B1* | 1/2019 | Xue | H02M 1/083 |
| 2007/0115055 | A1* | 5/2007 | Mendenhall | H03F 3/2173 330/251 |
| 2008/0225558 | A1* | 9/2008 | Gordon | H02M 3/337 363/21.15 |
| 2016/0322968 | A1* | 11/2016 | Mao | H02M 3/33561 |
| 2020/0195160 | A1* | 6/2020 | Mayell | H02M 3/33523 |

* cited by examiner

*Primary Examiner* — Patricia T Nguyen
(74) *Attorney, Agent, or Firm* — Angela M. Brunetti (57) ABSTRACT

An amplifier system having first and second interleaved half bridge stages and a coupled inductor. The coupled inductor has a primary winding and a secondary winding, a first end of the primary winding is coupled to the first half bridge stage at a first node, a second end of the primary winding is coupled to the load, a first end of the secondary winding is coupled to the load, a second end of the secondary winding is coupled to the second half bridge stage at a second node. An inductor circuit is coupled between the first and second half bridge stages and a first end of a load circuit.

18 Claims, 10 Drawing Sheets

SYSTEM AND METHOD TO REDUCE STANDBY POWER DISSIPATION IN CLASS D AMPLIFIERS

TECHNICAL FIELD

The present disclosure is directed to a class D amplifier and more particularly to a system and method to reduce standby power dissipation in a class D amplifier.

BACKGROUND

Class D amplifiers, and particularly high-power Class D audio amplifiers, have relatively high power dissipation at standby due to switching losses in semiconductor devices. Switching losses occur due to circulating ripple current at the semiconductor device. High ripple currents result in significant turn-off losses in the semiconductors. These losses increase with higher voltage rails, higher switching frequency, in semiconductors with slower switching speeds, and an increased number of audio channels.

Known methods, such an LC trap, ripple steering and interleaved half bridges, effectively reduce output ripple current (ripple current at the load) but they do not address high switching losses in the semiconductors, which result in high power dissipation at standby. An LC trap reduces output ripple current by tuning a series inductor capacitor circuit to the switching frequency. However, this is not very effective in reducing switching frequency harmonics. Also, semiconductor switching losses and power dissipation are not addressed by the LC trap. Ripple steering uses a coupled inductor at the amplifier output to minimize output ripple current but also does not address the impact on standby power dissipation at the semiconductors. Interleaved half bridge class D stages use two phases operating 180° out of phase and output ripple current is reduced from interleaving, but per phase ripple current is not reduced.

There is a need for a system and method to minimize switching losses resulting in much lower standby power dissipation in a class D amplifier.

SUMMARY

A class D amplifier system having first and second interleaved half bridge stages and a coupled inductor. The coupled inductor has a primary winding and a secondary winding. A first end of the primary winding is coupled to the first half bridge stage at a first node and a second end of the primary winding is coupled to a load. A first end of the secondary winding is coupled to the load and a second end of the secondary winding is coupled to the second half bridge stage at a second node. An inductor circuit is coupled between the first and second half bridge stages and a load. In one or more embodiments, the inductor circuit is a leakage inductance of the coupled inductor. In one or more embodiments, the inductor circuit has one or more inductors in series with the leakage inductance of the coupled inductor. In one or more embodiments, the leakage inductance of the coupled inductor is reflected to a secondary side of the coupled inductor.

Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

DETAILED DESCRIPTION

While various aspects of the present disclosure are described with reference to a particular illustrative embodiment, the present disclosure is not limited to such embodiments, and additional modifications, applications, and embodiments may be implemented without departing from the present disclosure. In the figures, like reference numbers will be used to illustrate the same components. Those skilled in the art will recognize that the various components set forth herein may be altered without varying from the scope of the present disclosure.

Figure 1A:
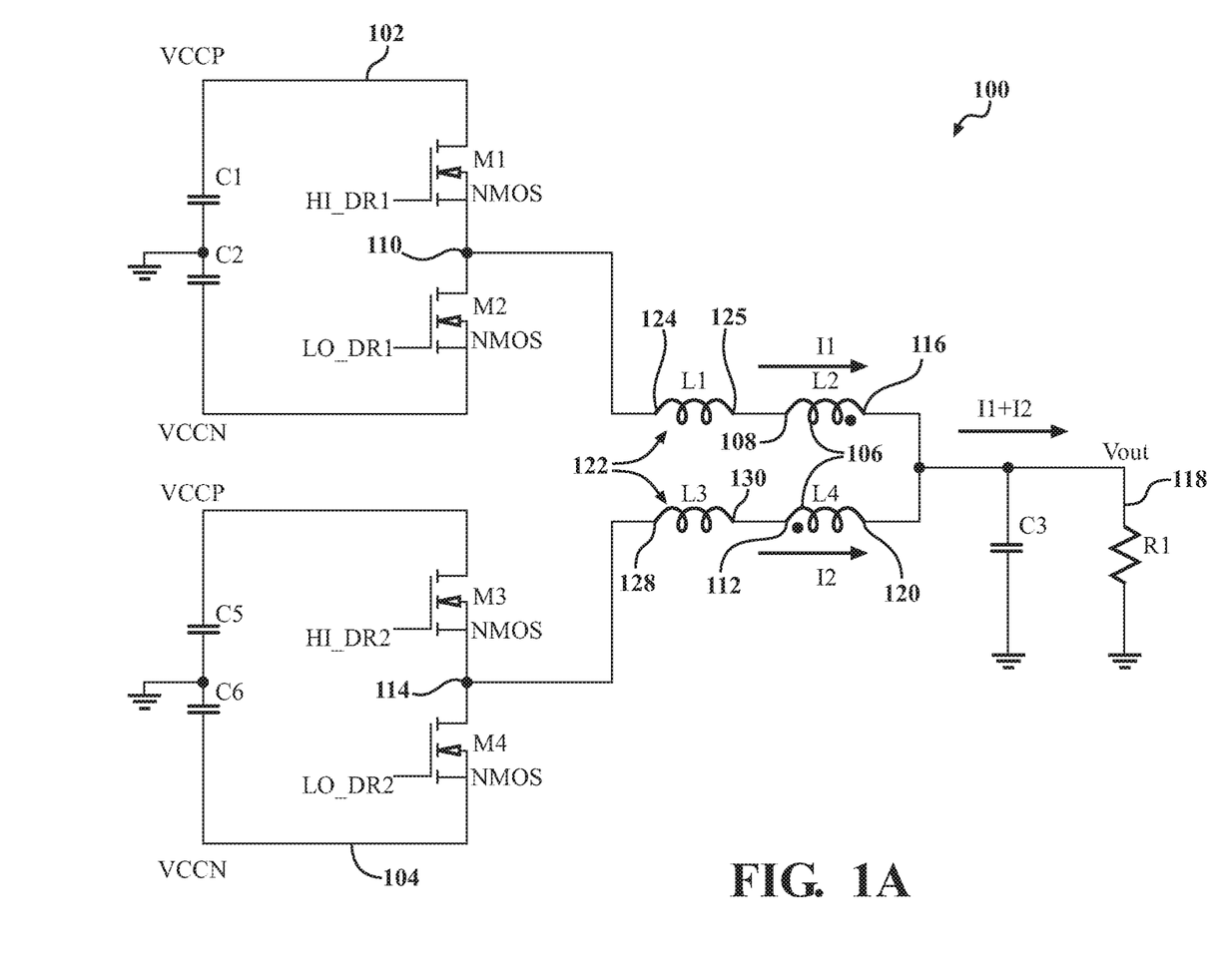
FIG. 1A is a schematic of a class D amplifier having two interleaved half bridge stages and a coupled inductor.
Figure 1B:
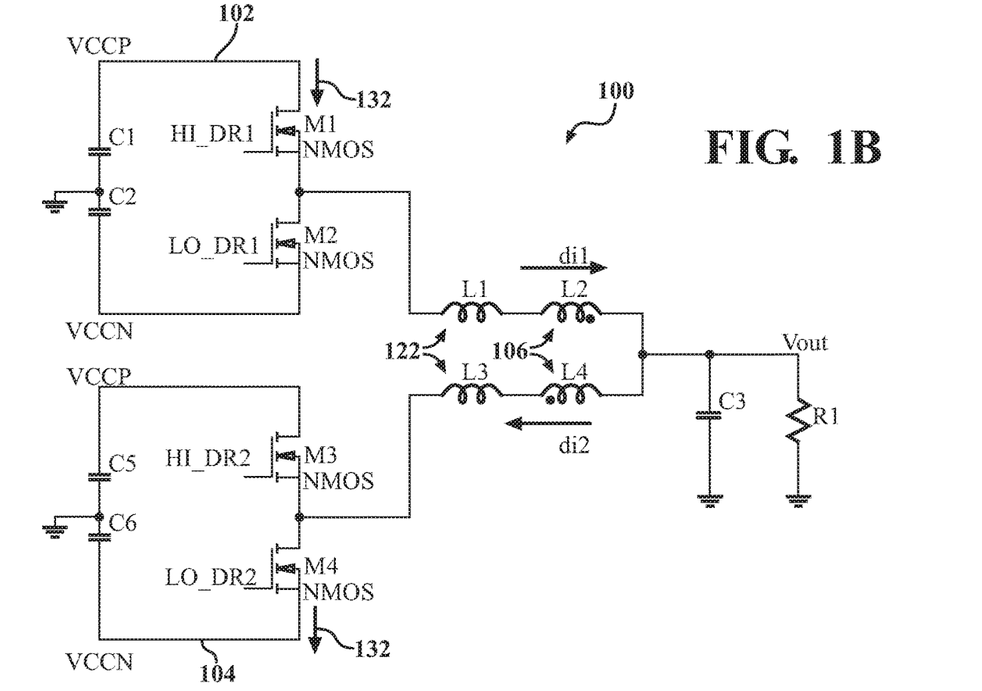
FIG. 1B is a schematic of the class D amplifier in FIG. 1A during a positive half cycle.
Figure 1C:
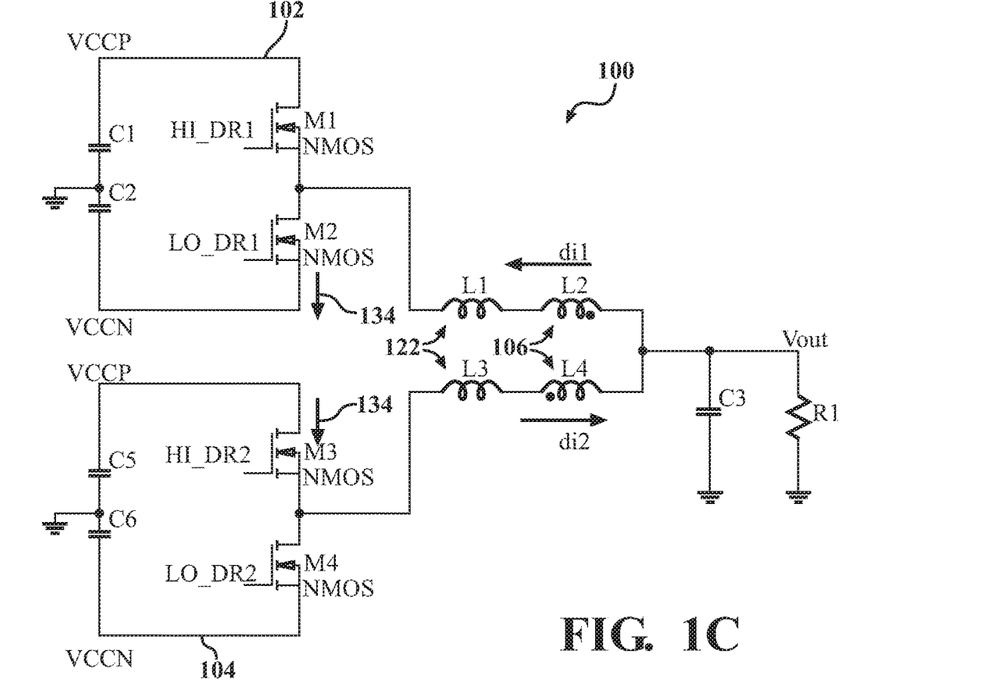
FIG. 1C is a schematic of the class D amplifier in FIG. 1A during a negative half cycle.

FIGS. 1A, 1B and 1C are schematics of one or more embodiments of a class D amplifier 100 having a first half bridge stage 102 interleaved with a second half bridge stage 104. A coupled inductor 106 is combined with the first and second interleaved half bridge stages 102, 104 to reduce ripple current in each phase. The coupled inductor 106 has a primary winding L2 and a secondary winding L4. A first end 108 of the primary winding L2 is coupled to the first half bridge stage at a node 110 between semiconductor switches M1 and M2. A second end 116 of the primary winding L2 is coupled to a load 118. A first end 120 of the secondary winding L4 is coupled to the load. A second end 112 of the secondary winding L4 is coupled to the second half bridge stage at a node 114 between semiconductor switches M3 and M4.

The coupled inductor 106 reduces the ripple current in each phase and reduces turn off switching loss in switches M1, M2, M3 and M4. An inductor circuit 122 coupled between the nodes of the first and second half bridge stages 102, 104 and the load 118 reduces output ripple current. The inductor circuit may be leakage inductance of the coupled inductor or it may be one or more separate and distinct inductors added in series with the coupled inductor 106.

In one or more embodiments shown in FIGS. 1A-1C, the inductor circuit 122 is made up of two inductors L1 and L3. A first end 124 of inductor L1 is coupled to the node 110 of the first half bridge stage and second end 125 of inductor L1 is coupled to the first end 108 of the primary winding L2. A first end 128 of inductor L3 is coupled to the node 114 of the second half bridge stage 104 and a second end 130 of inductor L3 is coupled to the second end 112 of the secondary winding L4. L1 may be considered leakage inductance of primary winding L2 and L3 may be considered the leakage inductance of secondary winding L4. L1 and L3 may also be separate, distinct, inductors added in the circuit that are in series with the coupled inductor 106.

Figure 2:
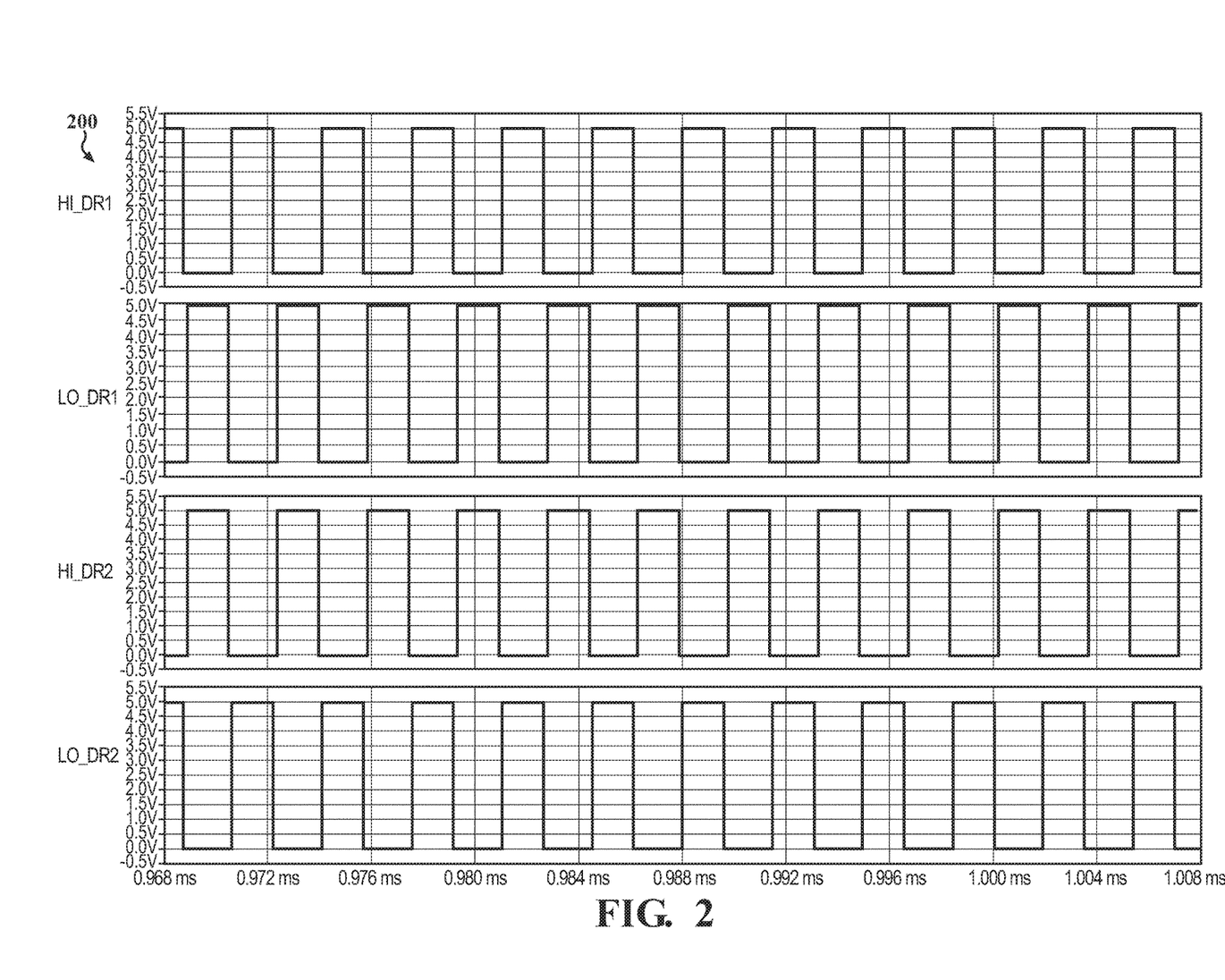
FIG. 2 is a timing waveform.

The first half bridge stage 102 and the second half bridge stage 104 are interleaved (180° out of phase with respect to each other). At standby, with a duty cycle of 50%, switches M1 and M4 are ON at the same time, followed by switches M2 and M3 being ON at the same time. This cycle repeats as shown in a timing waveform 200 of FIG. 2.

Referring again to FIG. 1A, the current in phase one, the first half bridge stage, is shown as I1. The current in phase two, the second half bridge stage, is shown as I2. The output current is equal to the sum of each phase current I1+I2. Referring to FIGS. 1B and 1C, the ripple current in phase one and two are shown as di1 and di2 respectively.

Referring to FIG. 1B, the ripple current flow is shown during a positive half cycle. When M1 and M4 are ON and M2 and M3 are OFF, a path exists for ripple current to flow through M1 to L1 to L2 to L4 to M4 as shown by arrows 132. The magnetizing inductance of the coupled inductor 106 limits the peak ripple current. In FIG. 1B the ripple current di1=di2 and their directions at the end of the positive half cycle are shown.

Referring to FIG. 1C, during a negative half cycle, when M2 and M3 are ON and M1 and M4 are OFF, the ripple current flows through M3 to L3 to L4 to L2 to M2 as shown by arrows 134. In FIG. 1C the ripple current di1=di2 and their directions at the end of the negative half cycle are shown.

The coupled inductor 106 along with the interleaved operation of the first half bridge stage 102 and the second half bridge stage 104 steers the ripple current away from the output. Also, due to a relatively high magnetizing inductance of the coupled inductor 106, the peak ripple current per phase is reduced resulting in lower semiconductor switching loss. The higher the magnetizing inductance, the lower the per phase peak ripple current, resulting in lower semiconductor switching losses at standby.

Figure 3A:
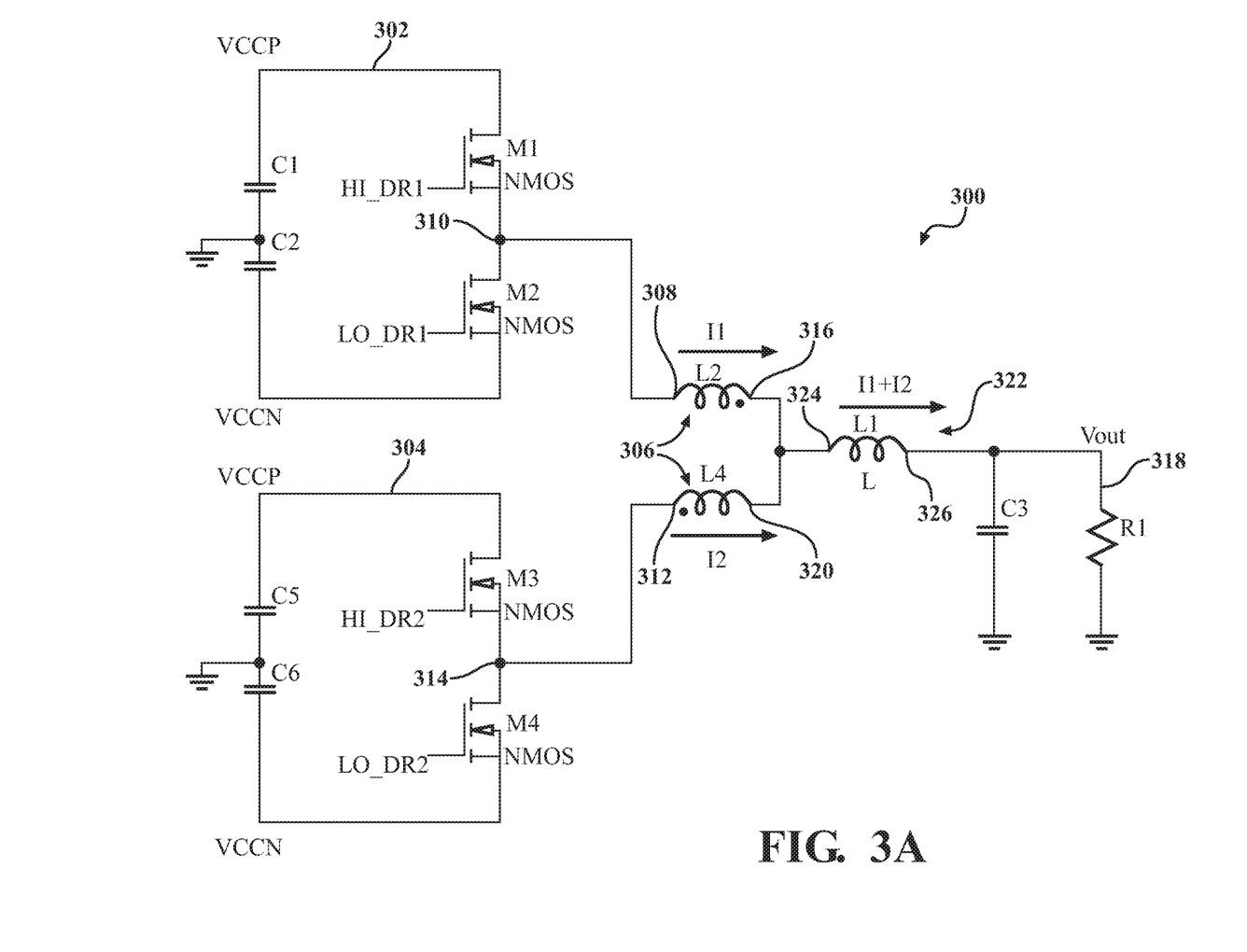
FIG. 3A is a schematic of a class D amplifier having two interleaved half bridge stages and a coupled inductor.
Figure 3B:
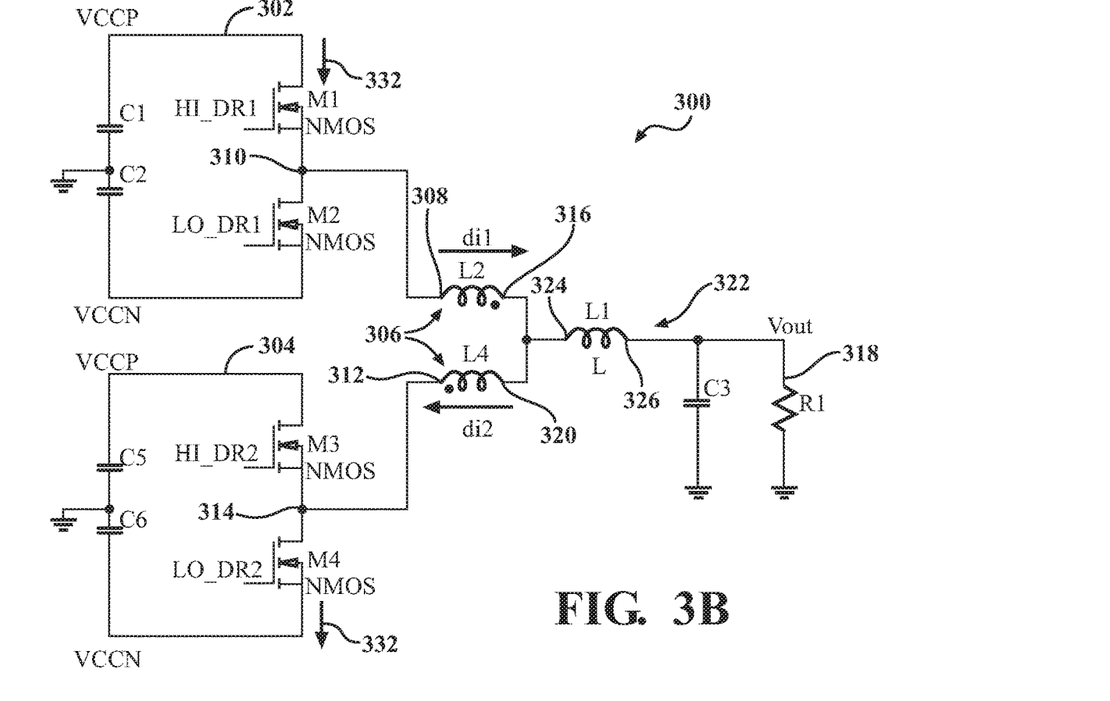
FIG. 3B is a schematic of the class D amplifier in FIG. 3A during a positive half cycle.
Figure 3C:
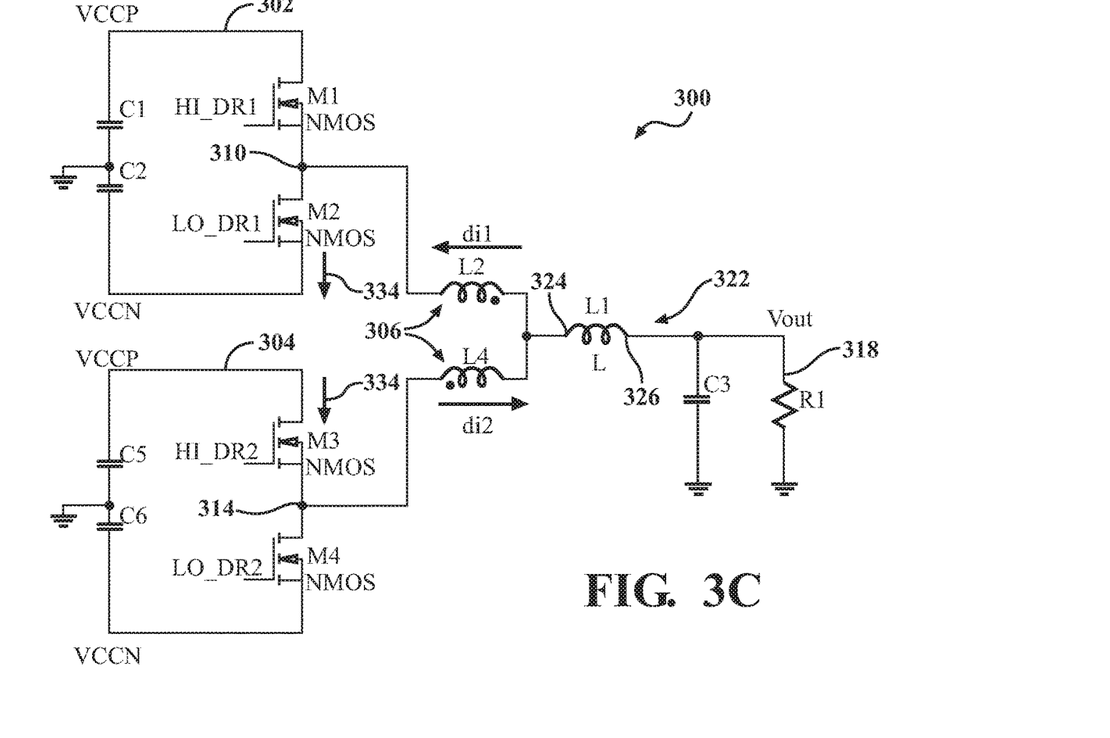
FIG. 3C is a schematic of the class D amplifier in FIG. 3A during a negative half cycle.

In one or more embodiments, shown in FIGS. 3A, 3B, and 3C a class D amplifier 300 is shown having a first half bridge stage 302 interleaved with a second half bridge stage 304. A coupled inductor 306 is combined with the first and second interleaved half bridge stages 302, 304 to reduce ripple current in each phase. The coupled inductor 306 has a primary winding L2 and a secondary winding L4. A first end 308 of the primary winding L2 is coupled to the first half bridge stage 302 at a node 310 between switches M1 and M2. A second end 316 of the primary winding L2 is coupled to a load 318. A first end 320 of the secondary winding L4 is coupled to the load 318. A second end 312 of the secondary winding L4 is coupled to the second half bridge stage 304 at a node 314.

The coupled inductor 306 reduces the ripple current in each phase and reduces turn off switching loss in switches M1, M2, M3 and M4. An inductor circuit 322 coupled between the nodes 310, 314 of the first and second half bridge stages 302, 304 and the load 318 reduces output ripple current. The inductor circuit 322 may be leakage inductance of the coupled inductor 306 or it may be a separate and distinct inductor, L1, added in series with the coupled inductor 306.

The inductor circuit 322 shown in FIGS. 3A-3C is a single inductor L1 having a first end 324 coupled to the second end 316 of the primary winding L2 and the first end 320 of the secondary winding L4. A second end 326 of the single inductor 322 is coupled to the load 318. L1 may be a separate discrete inductor or it may be the leakage inductances of coupled inductor 306 reflected to a secondary side 316, 320 of the coupled inductor 306. The inductance circuit 322 is coupled between the load and the coupled inductor 306 and the inductor circuit 322 reduces output ripple current while the coupled inductor 306 reduces ripple current in each phase.

The first half bridge stage 302 and the second half bridge stage 304 are interleaved (180° out of phase with respect to each other). At standby, with a duty cycle of 50%, switches M1 and M4 are ON at the same time, followed by switches M2 and M3 being ON at the same time. This cycle repeats as shown in a timing waveform 200 of FIG. 2.

Referring again to FIG. 3A, the current in phase one is shown as I1, the current in phase two is shown as I2. The output current is equal to the sum of each phase current I1+I2. Referring to FIGS. 3B and 3C, the ripple current in phase one and two are shown as di1 and di2 respectively.

Referring to FIG. 3B, during a positive half cycle, when M1 and M4 are ON and M2 and M3 are OFF, there exists a path for ripple current to flow through M1 to L2 to L4 to M4 as shown by arrows 332. The magnetizing inductance of the coupled inductor 306 limits the peak ripple current. In FIG. 3B the ripple current di1=di2 and their directions at the end of the positive half cycle are shown.

Referring to FIG. 3C, during a negative half cycle, when M2 and M3 are ON and M1 and M4 are OFF, there exists a path for ripple current to flow through M3 to L4 to L2 to M2 as shown by arrows 334. In FIG. 3C the ripple current di1=di2 and their directions at the end of the negative half cycle are shown.

The coupled inductor 306 along with the interleaved operation of the first half bridge stage 302 and the second half bridge stage 304 steers the ripple current away from the output. Also, due to a relatively high magnetizing inductance of the coupled inductor 306, the peak ripple current per phase is reduced resulting in lower semiconductor switching loss. The higher the magnetizing inductance, the lower the per phase peak ripple current, resulting in lower semiconductor switching losses at standby.

Figure 4A:
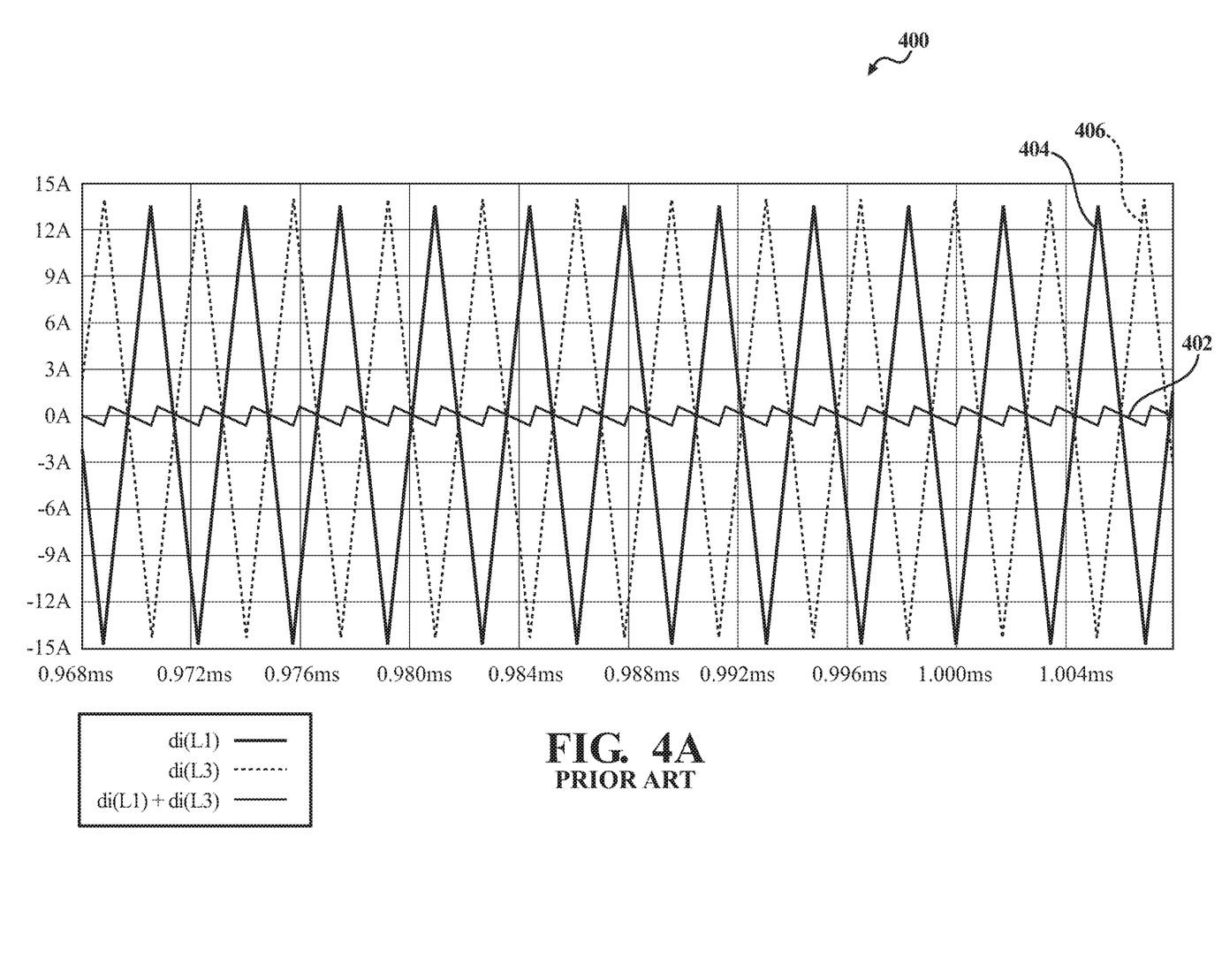
FIG. 4A is a simulation of two interleaved half bridge stages operating at a switching frequency of 288 kHz without a coupled inductor with +/−160V rails and L1=L3=10 uH.
Figure 4B:
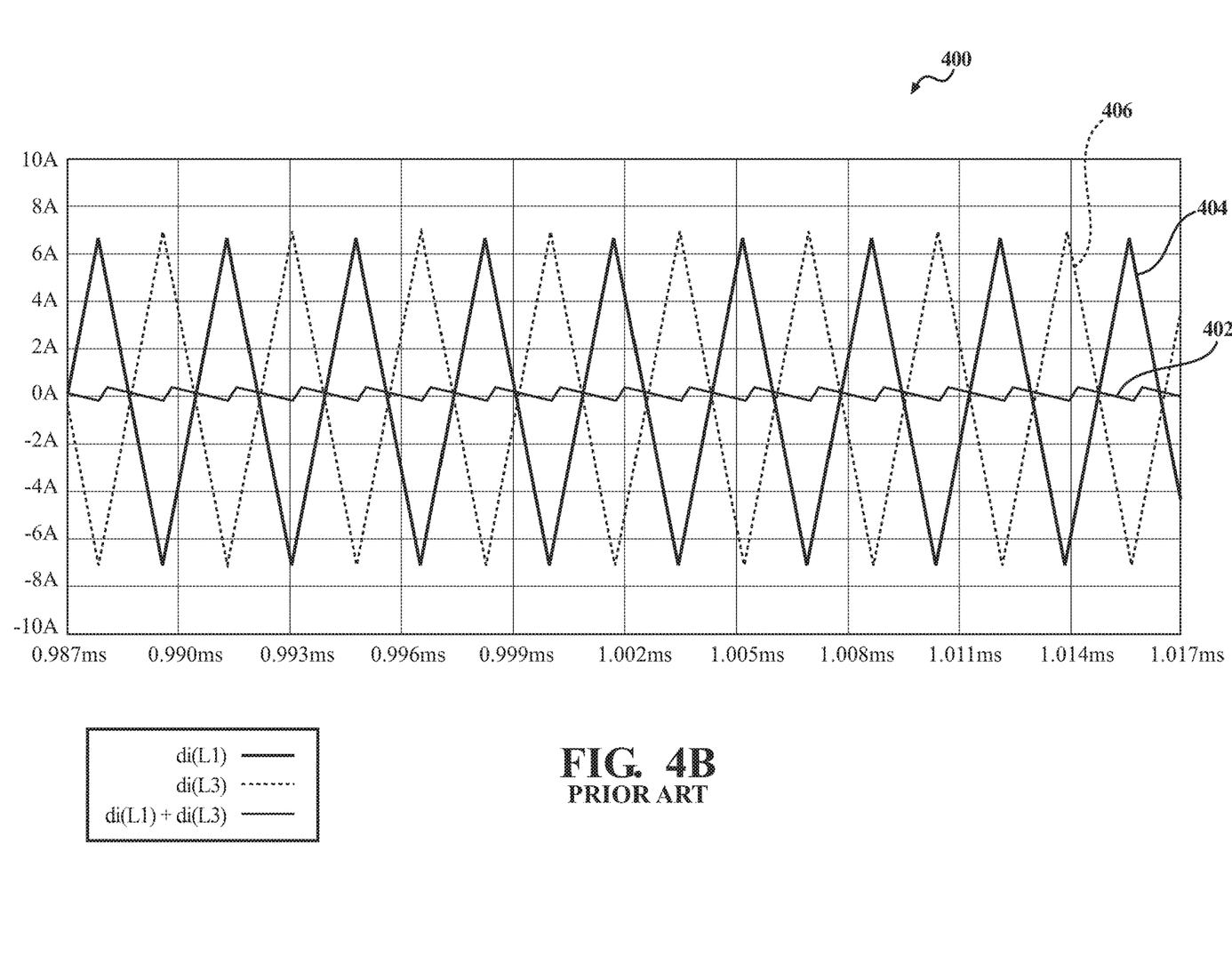
FIG. 4B is a simulation of two interleaved half bridge stages operating at a switching frequency of 288 Hz without a coupled inductor with +/−160V rails and L1=L3=20 uH.

FIG. 4A shows a simulation 400 of two interleaved half bridge stages operating at a switching frequency of 288 kHz without a coupled inductor with +/−160V rails and L1=L3=10 uH. As shown in FIG. 4A, the output ripple current 402 di(L1)+di(L3) is reduced. However, the peak ripple current (turn OFF current) in each half bridge stage is on the order of 12-14 A for each phase 404 di(L1) and 406 di(L3). FIG. 4B shows a simulation 400 of two interleaved half bridge stages operating at a switching frequency of 288 kHz without a coupled inductor with +/−160V rails and L1=L3=20 uH. As shown in FIG. 4B the output ripple current 402 di(L1)+di(L3) is reduced. However, the peak ripple current in each half bridge stage is on the order of 6-7 A for each phase 404 di(L1) and 406 di(L3).

Figure 5:
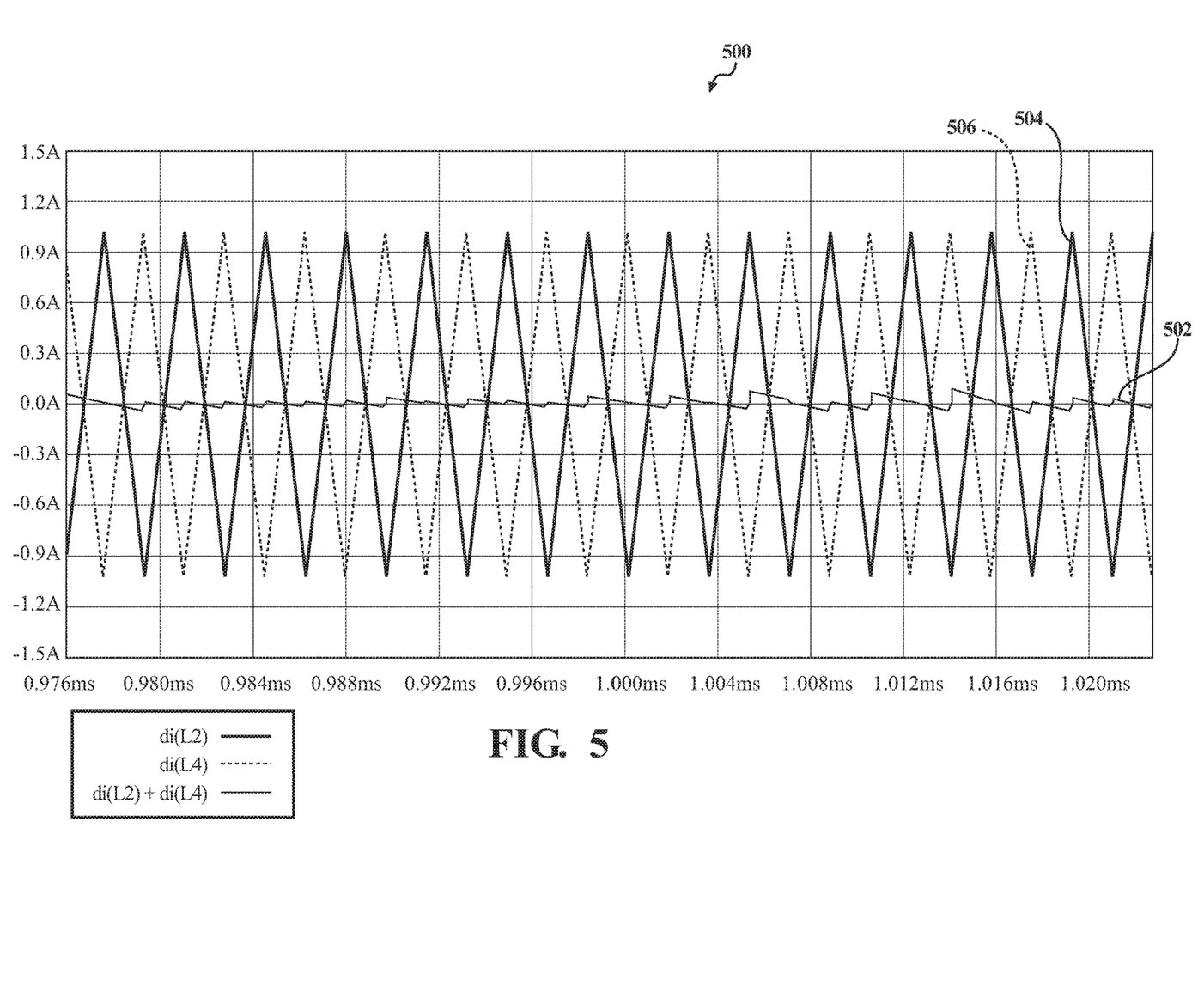
FIG. 5 is a simulation of two interleaved half bridge stages operating at a switching frequency of 288 kHz with a coupled inductor with +/−160V rails and L2=L4=100 uH, L1=L3=10 uH.

FIG. 5 is a simulation 500 of two interleaved half bridge stages operating at a switching frequency of 288 Hz with a coupled inductor with +/−160V rails and L2=L4=100 uH, L1=L3=10 uH according to the inventive subject matter. The output ripple current 502 di(L2)+di(L4) is reduced and the peak ripple current in each half bridge stage 504 di(L2) and 506 di(L4) is on the order of 1 A. A comparison of the graph of FIG. 5 to the graphs of FIGS. 4A and 4B show that the ripple current di(L2) and di(L4) in each half bridge stage is significantly lower than that of di(L1) and di(L3) of FIGS. 4A and 4B, resulting not only in reduced per phase ripple current, but also in lower switching losses and lower standby power dissipation.

Figure 6:
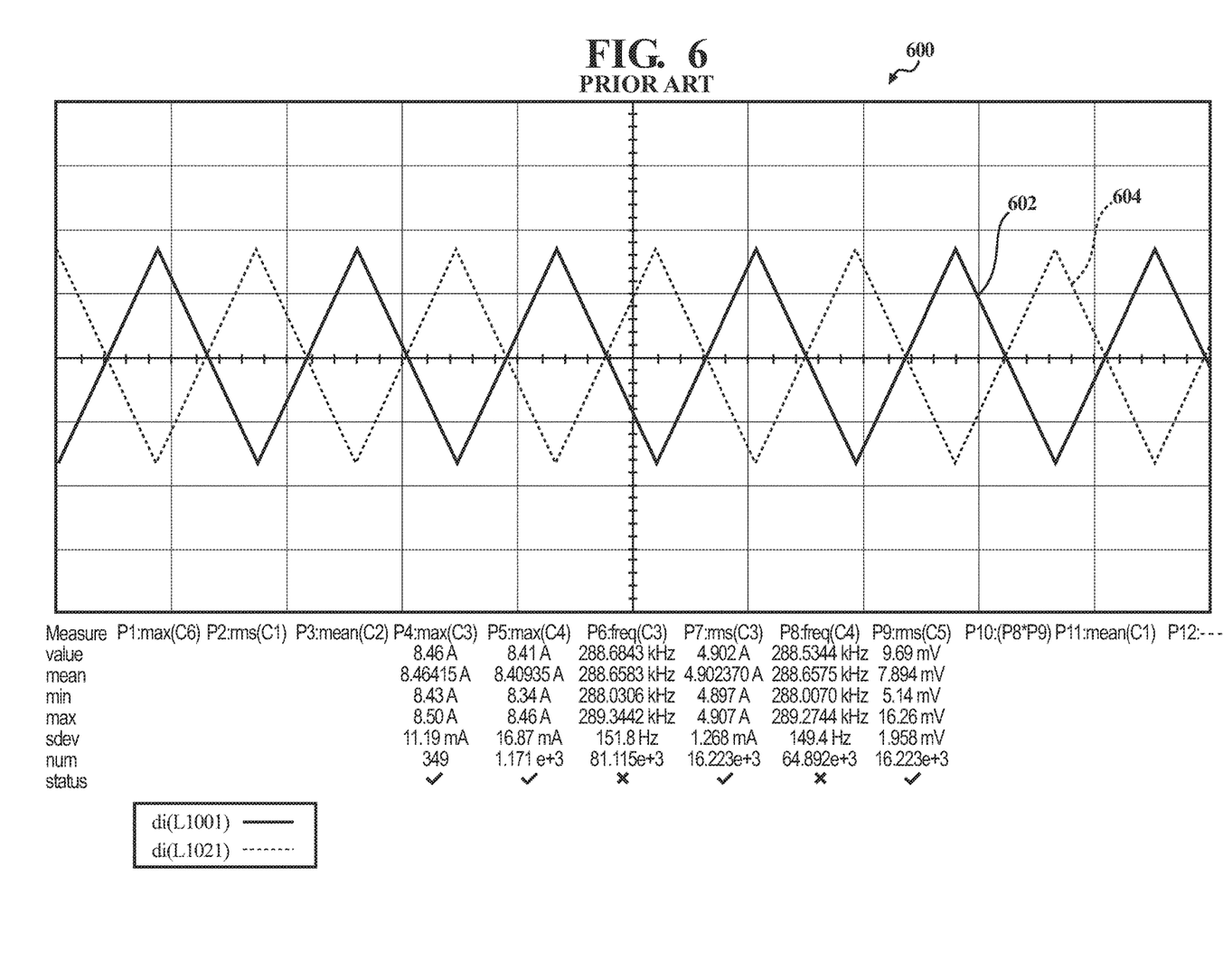
FIG. 6 shows per phase ripple current of Class D amplifier hardware with two interleaved half bridge stages operating at a switching frequency of 288 kHz without a coupled inductor with +/−160V rails and L1001=L1002=10 uH.

FIG. 6 shows per phase ripple current 600 of Class D amplifier hardware with two interleaved half bridge stages operating at a switching frequency of 288 kHz without a coupled inductor with +/−160V rails and L1001=L1002=20 uH. The maximum ripple current through each inductor 602, 604 is approximately 8.5 A with switching loss on the order of 32 W per Class D output channel at standby. This results in a total power dissipation, for 4 channels, on the order of 128 W.

Figure 7:
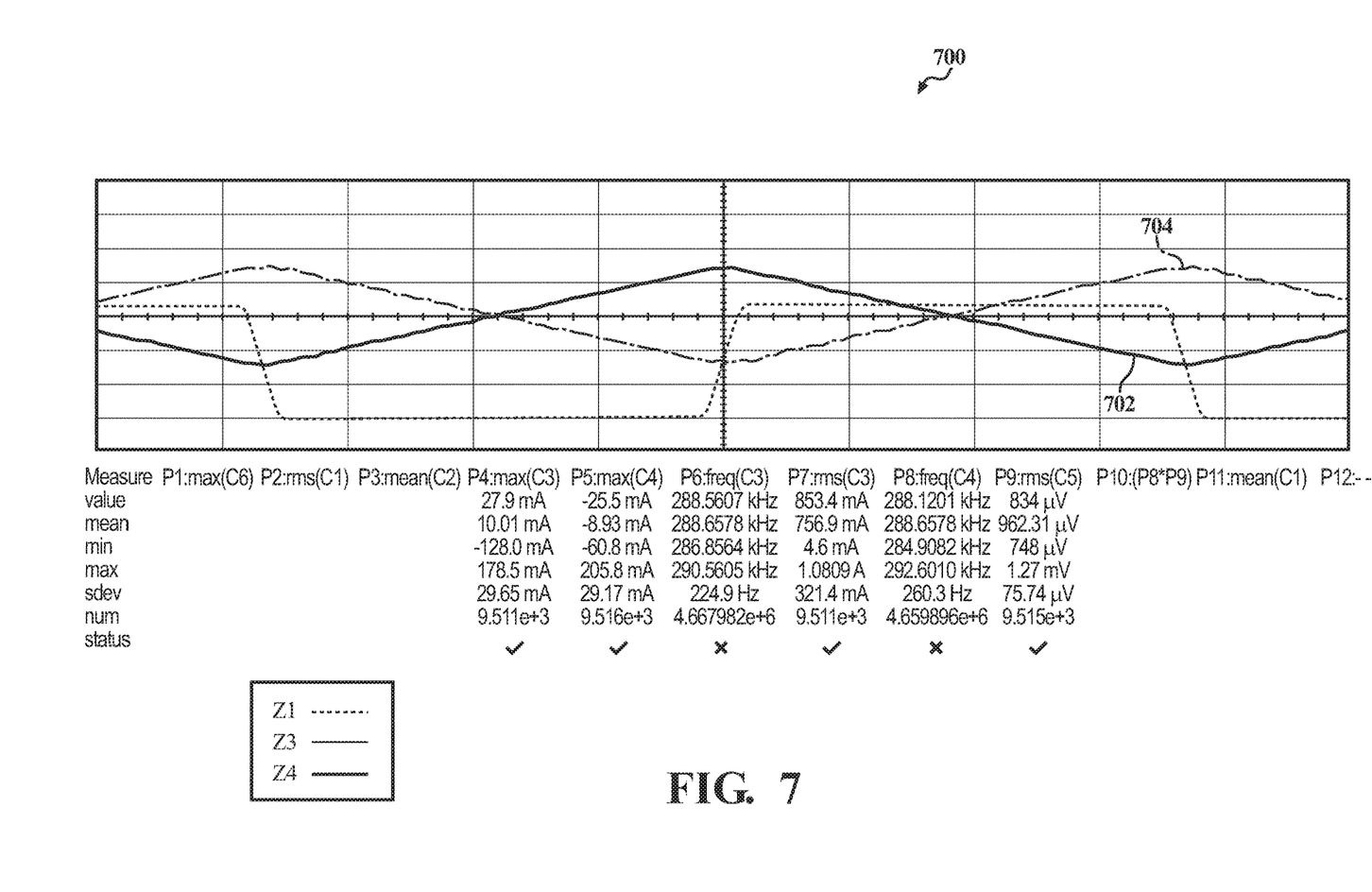
FIG. 7 shows per phase ripple current of Class D amplifier hardware with two interleaved half bridge stages operating at a switching frequency of 288 kHz with a 60 uH coupled inductor with +/−160V rails and L1001=L1002=10 uH.

FIG. 7 shows per phase ripple current 700 of Class D amplifier hardware with two interleaved half bridge stages operating at a switching frequency of 288 kHz with a 60 uH coupled inductor with +/−160V rails and L1001=L1002=10 uH according to the inventive subject matter. The maximum ripple current through the primary and secondary windings of the coupled inductor 702, 704 is on the order of 1.5 A, reduced from the results shown in FIG. 6 by more than 7 A. The switching loss is now less than 2 W per Class D output channel, reduced from the results shown in FIG. 6 by a factor of more than 16. The total power dissipation at standby is reduced to less than 8 W. The switch turn-off current may be further reduced by increasing the inductance of the coupled inductor and/or decreasing the switching frequency. Lowering standby power dissipation minimizes power being wasted and improves light load efficiency.

In the foregoing specification, the present disclosure has been described with reference to specific exemplary embodiments. Various modifications and changes may be made, however, without departing from the scope of the present disclosure as set forth in the claims. The specification and figures are illustrative, rather than restrictive, and modifications are intended to be included within the scope of the present disclosure. Accordingly, the scope of the present disclosure should be determined by the claims and their legal equivalents rather than by merely the examples described.

For example, the steps recited in any method or process claims may be executed in any order and are not limited to the specific order presented in the claims. Additionally, the components and/or elements recited in any apparatus claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

The terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present disclosure, in addition to those not specifically recited, may be varied or otherwise particularly adapted to specific environments, manufacturing specifications, design parameters or other operating requirements without departing from the general principles of the same.

The invention claimed is:

1. A class D amplifier system comprising:
   a first half bridge stage;
   a second half bridge stage interleaved with the first half bridge stage;
   a load circuit;
   a coupled inductor having a primary winding and a secondary winding, a first end of the primary winding is coupled to the first half bridge stage at a first node, a second end of the primary winding is coupled to the load circuit, a first end of the secondary winding is coupled to the load circuit, a second end of the secondary winding is coupled to the second half bridge stage at a second node; and
   an inductor circuit is coupled between the first and second half bridge stages and a first end of the load circuit.

2. The amplifier of claim 1 wherein the inductor circuit further comprises a leakage inductance of the coupled inductor.

3. The amplifier of claim 2, wherein the inductor circuit is a leakage inductance of the primary winding and a leakage inductance of the secondary winding.

4. The amplifier of claim 3, further comprising:
   a first inductor in series with the leakage inductance of the primary winding and the first half bridge stage; and
   a second inductor in series with the leakage inductance of the secondary winding and the second half bridge stage.

5. The amplifier of claim 2, wherein the leakage inductance of the coupled inductor is reflected to a secondary side of the coupled inductor.

6. The amplifier of claim 5, further comprising an inductor in series with the leakage inductance of the coupled inductor and the load.

7. A method for reducing power dissipation in a class D amplifier system having interleaved first and second half bridge stages, the method comprising:
   configuring a primary winding of a coupled inductor to the first half bridge stage and a load;
   configuring a secondary winding of the coupled inductor to the load and the second half bridge stage; and
   configuring an inductance circuit between the load and the first and second half bridge stages, wherein the coupled inductor reduces peak ripple current in each phase of the first and second half bridge stages and the inductor circuit reduces output ripple current at the load.

8. The method of claim 7, wherein the step of configuring an inductance circuit further comprises configuring the inductance circuit as leakage inductance of the coupled inductor.

9. The method of claim 8, wherein the step of configuring an inductance circuit further comprises configuring the inductance circuit as leakage inductance of the primary winding and leakage inductance of the secondary winding.

10. The method of claim 9, wherein the inductance circuit further comprises first and second inductors, the method further comprises the steps of:
- configuring the first inductor in series with the first half-stage bridge and a first end of a primary winding of the coupled inductor; and
- configuring the second inductor in series with the second half-stage bridge and a second end of the secondary winding.

11. The method of claim 8, wherein the step of configuring the inductance circuit further comprises the steps of:
- configuring a leakage inductance of the primary winding to a secondary side of the coupled inductor; and
- configuring a leakage inductance of the secondary winding to a secondary side of the coupled inductor.

12. The method of claim 8, wherein the inductance circuit further comprises a first inductor, the method further comprises the step of configuring the first inductor in series with the coupled inductor and the load.

13. An amplifier system, comprising:
- first and second half bridges configured to operate 180° out of phase with each other;
- a coupled inductor having a primary winding and a secondary winding configured to limit per phase peak ripple current; and
- an inductance circuit configured to reduce output ripple current.

14. The system of claim 13, wherein the inductance circuit is leakage inductance of the coupled inductor.

15. The system of claim 14 wherein the leakage inductance of the coupled inductor further comprises a leakage inductance of the primary winding and a leakage inductance of the secondary winding.

16. The system of claim 15, further comprising:
- a first inductor in series with the leakage inductance of the primary winding; and
- a second inductor in series with the leakage inductance of the secondary winding.

17. The system of claim 13, wherein the leakage inductance of the couple inductor is reflected to a secondary side of the coupled inductor.

18. The system of claim 17, further comprising a first inductor in series with the leakage inductance reflected to the secondary side of the coupled inductor.

* * * * *